(12) United States Patent
Matsumura et al.

(10) Patent No.: US 8,632,876 B2
(45) Date of Patent: Jan. 21, 2014

(54) LAMINATED POLYESTER FILM FOR SOLAR CELL BACKSHEETS

(75) Inventors: Naoko Matsumura, Gifu (JP); Atsushi Oyamatsu, Gifu (JP)

(73) Assignee: Teijin Dupont Films Japan Limited, Tokyo (JP)

( * ) Notice: Subject to any disclaimer, the term of this patent is extended or adjusted under 35 U.S.C. 154(b) by 0 days.

(21) Appl. No.: 13/259,884

(22) PCT Filed: Mar. 30, 2010

(86) PCT No.: PCT/JP2010/055639
§ 371 (c)(1),
(2), (4) Date: Sep. 23, 2011

(87) PCT Pub. No.: WO2010/113920
PCT Pub. Date: Oct. 7, 2010

(65) Prior Publication Data
US 2012/0021197 A1   Jan. 26, 2012

(30) Foreign Application Priority Data
Mar. 31, 2009 (JP) ................................ 2009-086058
Mar. 31, 2009 (JP) ................................ 2009-086059

(51) Int. Cl.
*B32B 7/02* (2006.01)

(52) U.S. Cl.
USPC .......................................... 428/213; 428/220

(58) Field of Classification Search
USPC ........................................................ 428/213
See application file for complete search history.

(56) References Cited

U.S. PATENT DOCUMENTS

| | | | | |
|---|---|---|---|---|
| 6,130,278 A * | 10/2000 | Hibiya et al. | ............... | 524/322 |
| 6,222,115 B1 | 4/2001 | Nakanishi | | |
| 6,686,031 B2 * | 2/2004 | Matsufuji et al. | ............ | 428/212 |
| 2002/0018886 A1* | 2/2002 | Matsufuji et al. | ............ | 428/328 |
| 2006/0263592 A1* | 11/2006 | Kusume et al. | ............... | 428/480 |
| 2008/0311385 A1* | 12/2008 | Miyazaki et al. | ............. | 428/330 |
| 2009/0034235 A1 | 2/2009 | Kusume et al. | | |
| 2010/0000603 A1 | 1/2010 | Tsuzuki et al. | | |
| 2010/0016539 A1* | 1/2010 | Kohno et al. | ................ | 528/209 |
| 2010/0307570 A1* | 12/2010 | Aoyama et al. | .............. | 136/252 |

FOREIGN PATENT DOCUMENTS

| | | | |
|---|---|---|---|
| EP | 1759834 A1 * | 3/2007 | |
| JP | 6-38264 U | 5/1994 | |
| JP | 2001-148497 A | 5/2001 | |
| JP | 2001162930 A * | 6/2001 | |
| JP | 2001-257372 A | 9/2001 | |
| JP | 2002-26354 A | 1/2002 | |
| JP | 2002-100788 A | 4/2002 | |
| JP | 2002-134770 A | 5/2002 | |
| JP | 2002-134771 A | 5/2002 | |
| JP | 2002-270025 A | 9/2002 | |
| JP | 2003-60218 A | 2/2003 | |
| JP | 2003-213144 A | 7/2003 | |
| JP | 2004-130536 A | 4/2004 | |
| JP | 2006-212925 A | 8/2006 | |
| JP | 2006-306910 A | 11/2006 | |
| JP | 2007-7885 A | 1/2007 | |
| JP | 2007-078786 A | 3/2007 | |
| JP | 2007-129204 A | 5/2007 | |
| JP | 2008-169277 A | 7/2008 | |
| JP | 2008-183760 A | 8/2008 | |
| JP | 2009-046630 A | 3/2009 | |
| JP | 2009046630 A * | 3/2009 | |
| WO | 2005/026241 A1 | 3/2005 | |
| WO | 2007/007882 A1 | 1/2007 | |
| WO | 2007/063860 A1 | 6/2007 | |
| WO | WO 2008010607 A1 * | 1/2008 | |

OTHER PUBLICATIONS

Machine_English_Translation_JP_2009046630_A; White Polyester Film; Mar. 5, 2009; JPO; whole document.*
Machine_English_Translation_JP_2001162930_A; Laminated White Polyester Film for Ink Jet Printer Image Receiving Paper; Jun. 19, 2001; JPO; whole document.*

* cited by examiner

*Primary Examiner* — David Sample
*Assistant Examiner* — Tahseen N Khan
(74) *Attorney, Agent, or Firm* — Sughrue Mion, PLLC

(57) ABSTRACT

In a laminated polyester film for solar cell backsheets, which includes a surface layer (A) and a substrate layer (B), the surface layer (A) is made of a polyester composition including 10 to 30 wt % of rutile-type titanium dioxide particles and 70 to 90 wt % of a polyester, the substrate layer (B) is made of a polyester composition including 0.1 to 4 wt % of rutile-type titanium dioxide particles and 96 to 99.9 wt % of a polyester, the substrate layer (B) has a thickness of 70% to 97% of the total film thickness, the weight average molecular weight and COOH end group concentration of polyester in the laminated film are 47,000 to 65,000 and 6 to 25 eq/ton, respectively, and the average content of rutile-type titanium dioxide particles in all layers of the laminated film is 3 to 8 wt %. As a result, a laminated polyester film for solar cell backsheets, which has excellent weatherability and hydrolysis resistance and is capable of maintaining strength over a long period of time, is provided.

10 Claims, No Drawings

LAMINATED POLYESTER FILM FOR SOLAR CELL BACKSHEETS

CROSS REFERENCE TO RELATED APPLICATION

This application is a National Stage of International Application No. PCT/JP2010/055639 filed Mar. 30, 2010, the contents of which are incorporated herein by reference in their entirety.

TECHNICAL FIELD

The present invention relates to a laminated polyester film for solar cell backsheets and also to a solar cell backsheet using the same. Specifically, the invention relates to a laminated polyester film for solar cell backsheets, which has excellent mechanical properties and heat resistance, and also to a solar cell backsheet using the same.

BACKGROUND ART

In recent years, solar power generation systems have been spreading as a means of power generation utilizing clean energy. As described in JP-UM-6-38264, for example, a solar cell module generally has a structure in which a plurality of plate-like solar cell devices are sandwiched between a light-receiving-side glass substrate and a backsheet, with the interspace being filled with an encapsulating resin.

Further, as a backsheet of a solar cell, use of a polyester film is known (JP-A-2001-148497, JP-A-2001-257372, and JP-A-2003-60218). These polyester films are still insufficient in terms of hydrolysis resistance for long-term use, and attempts for improvement have been made. It has been proposed to use a high-molecular-weight polyethylene terephthalate film (JP-A-2002-26354), a polyethylene terephthalate film having a low oligomer content (JP-A-2002-100788, JP-A-2002-134770, and JP-A-2002-134771), and a polyester film containing 2,6-naphthalene dicarboxylic acid (JP-A-2007-007885 and JP-A-2006-306910). Further, a white polyester film having high reflectance has also been proposed, which is advantageous in terms of the efficiency of conversion of sunlight into electricity (JP-A-2002-26354 and JP-A-2006-270025).
Patent Document 1: JP-UM-6-38264
Patent Document 2: JP-A-2001-148497
Patent Document 3: JP-A-2001-257372
Patent Document 4: JP-A-2003-60218
Patent Document 5: JP-A-2002-26354
Patent Document 6: JP-A-2002-100788
Patent Document 7: JP-A-2002-134770
Patent Document 8: JP-A-2002-134771
Patent Document 9: JP-A-2007-007885
Patent Document 10: JP-A-2006-306910
Patent Document 11: JP-A-2002-270025

DISCLOSURE OF THE INVENTION

Problems that the Invention is to Solve

However, as well as hydrolysis resistance, the weatherability of a polyethylene terephthalate film is also poor. Therefore, even with these improved techniques, it is still difficult to maintain practical strength as a solar cell backsheet over a long period of time. Further, a white polyethylene terephthalate film, from which high reflectance can be expected, has poor hydrolysis resistance, and, in addition, the cohesive strength of such a film is low. Therefore, when the film is bonded to other materials to form a laminate, delamination may occur between layers. Also, with respect to a polyester film containing a 2,6-naphthalene dicarboxylic acid component, although hydrolysis resistance is improved, such a film is susceptible to degradation by ultraviolet light and has poor weatherability.

The invention is aimed to solve such problems of the prior art and provide a laminated polyester film for solar cell backsheets and a solar cell backsheet, which have excellent weatherability and hydrolysis resistance and are capable of maintaining strength over a long period of time.

Secondly, the invention is aimed to provide a laminated polyester film for solar cell backsheets and a solar cell backsheet, which have, in addition to the light resistance and hydrolysis resistance mentioned above, high film cohesive strength together with excellent extrudability in film production.

Thirdly, the invention is aimed to provide a laminated polyester film for solar cell backsheets and a solar cell backsheet, which have, in addition to the light resistance and hydrolysis resistance mentioned above, excellent mechanical properties and heat resistance.

Means for Solving the Problems

The present inventors conducted extensive research to solve the problems of the prior art. As a result, they found the following measures and accomplished the invention.

That is, firstly, the invention is a laminated polyester film for solar cell backsheets, which is a laminated film including a surface layer (A) and a substrate layer (B) and is characterized in that the surface layer (A) is provided on at least one side of the substrate layer (B), the surface layer (A) is made of a polyester composition including 10 to 30 wt % of rutile-type titanium dioxide particles and 70 to 90 wt % of a polyester, the substrate layer (B) is made of a polyester composition including 0.1 to 4 wt % of rutile-type titanium dioxide particles and 96 to 99.9 wt % of a polyester, the substrate layer (B) has a thickness of 70% to 97% of the total film thickness, the weight average molecular weight of polyester in the laminated film is 47000 to 65000, the COOH end group concentration of polyester in the laminated film is 6 to 25 eq/ton, and the average content of rutile-type titanium dioxide particles in all layers of the laminated film is 3 to 8 wt %.

The invention encompasses, as a second invention that is a preferred embodiment, a laminated polyester film for solar cell backsheets, which is a laminated film including a surface layer (A) and a substrate layer (B) and is characterized in that the surface layer (A) is provided on one side of the substrate layer (B), the surface layer (A) is made of a polyester composition including 10 to 30 wt % of rutile-type titanium dioxide particles and 70 to 90 wt % of a polyester, the substrate layer (B) is made of a polyester composition including 0.4 to 3 wt % of rutile-type titanium dioxide particles and 97 to 99.6 wt % of a polyester, the substrate layer (B) has a thickness of 70% to 97% of the total film thickness, the weight average molecular weight of polyester in the laminated film is 47000 to 65000, the COOH end group concentration of polyester in the laminated film is 6 to 25 eq/ton, the average content of rutile-type titanium dioxide particles in all layers of the laminated film is 3 to 8 wt %, and the substrate layer (B) has an intra-layer cohesive strength of not less than 8 N/15 mm.

The invention encompasses, as a third invention that is a preferred embodiment, a laminated polyester film for solar cell backsheets, which is a laminated film including a surface layer (A) and a substrate layer (B) and is characterized in that the surface layer (A) is provided on each side of the substrate layer (B), the surface layer (A) is made of a polyester composition including 10 to 30 wt % of rutile-type titanium dioxide particles and 70 to 90 wt % of a polyester, the substrate layer (B) is made of a polyester composition including 0.1 to 4 wt % of rutile-type titanium dioxide particles and 96 to 99.9 wt % of a polyester, the substrate layer (B) has a thickness of 70% to 95% of the total film thickness, the weight average molecular weight of the laminated polyester film is 47000 to 65000, the COOH end group concentration of polyester in the laminated film is 6 to 25 eq/ton, and the average content of rutile-type titanium dioxide particles in all layers of the laminated film is 3 to 8 wt %.

Advantage of the Invention

According to the invention, a laminated polyester film for solar cell backsheets and a solar cell backsheet, which have excellent weatherability and hydrolysis resistance and are capable of maintaining strength over a long period of time, can be provided.

According to the invention, secondly, a laminated polyester film for solar cell backsheets and a solar cell backsheet, which have, in addition to the light resistance and hydrolysis resistance mentioned above, high film cohesive strength together with excellent extrudability in film production, can be provided.

According to the invention, thirdly, a laminated polyester film for solar cell backsheets and a solar cell backsheet, which have, in addition to the light resistance and hydrolysis resistance mentioned above, excellent mechanical properties and heat resistance, can be provided.

BEST MODE FOR CARRYING OUT THE INVENTION

Hereinafter, the invention will be described in detail.
Layer Structure

The laminated polyester film for solar cell backsheets of the invention includes a surface layer (A) and a substrate layer (B), and the surface layer (A) is provided on at lease one side of the substrate layer (B).

In order for the laminated polyester film for solar cell backsheets of the invention to have both weatherability and hydrolysis resistance, it is preferable that the surface layer (A) is provided on each side of the substrate layer (B), forming a three-layer structure: surface layer (A)/substrate layer (B)/surface layer (A).

In the case of this three-layer structure, from the viewpoint of improving the weatherability of the polyester film, the surface layer (A) having a higher rutile-type titanium dioxide content serves as both surface layers of the laminated film, and, from the viewpoint of improving the hydrolysis resistance, the substrate layer (B) having a lower rutile-type titanium dioxide content is placed as a core layer. According to the invention, the three-layer structure of surface layer (A)/substrate layer (B)/surface layer (A) is employed; owing such a symmetrical laminated structure, the film is prevented from warping, and a laminated polyester film for solar cell backsheets, which is easy to handle during film production or processing, can be provided.

In the case of the three-layer structure mentioned above, the thickness of the substrate layer (B) is 70% to 95%, preferably 80% to 95%, of the total film thickness. When the thickness of the substrate layer (B) is less than 70%, the film has poor hydrolysis resistance, and the retention of strength and elongation is reduced, accelerating degradation. Meanwhile, when the thickness is more than 95%, the thickness of the surface layer (A) is relatively small, and the film does not have sufficient weatherability, resulting in more film discoloration or a greater reduction in mechanical strength caused by ultraviolet light. Incidentally, the total surface layer thickness is the total thickness of the two surface layers. In order for the laminated polyester film for solar cell backsheets of the invention to have all of weatherability, hydrolysis resistance, and adhesion to other laminated materials, it is preferable that the surface layer (A) is provided on one side of the substrate layer (B), forming a two-layer structure: surface layer (A)/substrate layer (B).

In the case of this two-layer structure, when the laminated polyester film for solar cell backsheets of the invention is used as a solar cell backsheet, the film is placed in such a manner that the surface layer (A) having a higher content of titanium oxide particles is on the outer side of a solar cell module from the viewpoint of improving the weatherability of the polyester film and also protecting the solar cell from ultraviolet light, while the substrate layer (B) having a lower content of titanium oxide particles is on the inner side of the module from the viewpoint of improving the hydrolysis resistance and adhesion to other laminated materials.

In the case of the two-layer structure mentioned above, the thickness of the substrate layer (B) is 70% to 97%, preferably 80% to 97%, of the total film thickness. When the thickness of the substrate layer (B) is less than 70%, the film has poor hydrolysis resistance, and the retention of strength and elongation is reduced, accelerating degradation. Meanwhile, when the thickness is more than 97%, the thickness of the surface layer (A) is relatively small, and the film does not have sufficient weatherability, resulting in more film discoloration or a greater reduction in mechanical strength caused by ultraviolet light.

Polyester

As the polyester in the invention, a thermoplastic polyester is used, and it is preferable to use a thermoplastic aromatic polyester. Examples of such aromatic polyesters include polyethylene terephthalate, polyethylene isophthalate, polybutylene terephthalate, polypropylene terephthalate, polycyclohexane dimethylene terephthalate, and polyethylene naphthalate. They may be homopolymers or copolymers. A blend of a plurality of polymers is also possible.

Of these polyesters, polyethylene terephthalate and polyethylene naphthalate are preferable for their excellent characteristics as a film. Polyethylene terephthalate is inexpensive and thus particularly preferable.

When a copolymer of polyethylene terephthalate is used as the polyester, examples of copolymerization components include aromatic dicarboxylic acid components, such as isophthalic acid, 2,6-naphthalene dicarboxylic acid, and 4,4'-diphenyl dicarboxylic acid, and diol components, such as 1,4-butanediol, 1,4-cyclohexane dimethanol, and 1,6-hexanediol. The proportions of copolymerization components are such that the melting point of the resulting polymer is within a range of 245 to 280° C., and preferably 250 to 280° C. A polymer melting point of less than 245° C. results in reduced heat resistance, while a melting point of more than 280° C. is undesirable in terms of productivity.

The intrinsic viscosity of the polyester is preferably not less than 0.68 dl/g, and still more preferably not less than 0.70 to 0.95 dl/g. When the intrinsic viscosity is less than 0.68 dl/g, it is difficult to adjust the weight average molecular weight of the film within a range of 47,000 to 65,000, and also the film is prone to delamination; therefore, this is undesirable. When the intrinsic viscosity is more than 0.95 dl/g, the melt viscosity is high, making it difficult to perform melt extruding, and also the polymerization time is prolonged, which is uneconomical; therefore, this is undesirable.

Rutile-type Titanium Dioxide Particles

The laminated polyester film for solar cell backsheets of the invention contains rutile-type titanium dioxide particles in the surface layer (A) and the substrate layer (B). The crystal form of a titanium oxide is a rutile type or an anatase type. In the invention, rutile-type titanium dioxide particles are used. By using rutile-type titanium dioxide particles, film degradation caused by ultraviolet light can be suppressed, resulting in less film discoloration or a smaller reduction in mechanical strength during long-term light irradiation.

The average particle size of the rutile-type titanium dioxide particles is preferably 0.1 to 5.0 µm, and particularly preferably 0.1 to 3.0 µm. An average particle size of less than 0.1 µm results in poor dispersibility, causing particle aggregation, whereby a uniform film cannot be obtained; therefore, this is undesirable. Meanwhile, when it is more than 5.0 µm, the stretchability of the film is reduced; therefore, this is undesirable.

As a method for dispersing and adding rutile-type titanium dioxide particles into a polyester to give a polyester composition containing rutile-type titanium dioxide particles, various methods are usable. As typical examples thereof, the following methods can be mentioned: (a) a method in which rutile-type titanium dioxide particles are added before the completion of transesterification or esterification in polyester synthesis or added before the initiation of polycondensation; (b) a method in which rutile-type titanium dioxide particles are added to a polyester, and melt-kneaded; (c) in the method (a) or (b), master pellets containing a large amount of rutile-type titanium dioxide particles are produced, and mixed with a polyester containing no rutile-type titanium dioxide particles to add a predetermined amount of rutile-type titanium dioxide particles thereto; and (d) a method in which the master pellets of (c) are directly used.

Content of Rutile-Type Titanium Dioxide Particles

The surface layer (A) contains rutile-type titanium dioxide particles in an amount of 10 to 30 wt %, preferably 14 to 25 wt %, per 100 wt % of the polyester composition forming the layer (A). When the content is less than 10 wt %, the film does not have sufficient weatherability, and is susceptible to degradation by ultraviolet light. Meanwhile, a content of more than 30 wt % results in poor adhesion to the substrate layer (B), and delamination occurs at the lamination interface. In addition, the film has reduced hydrolysis resistance, and degrades quickly.

In the case of a two-layer structure where the surface layer (A) is provided on one side of the substrate layer (B), the substrate layer (B) contains rutile-type titanium dioxide particles in an amount of 0.4 to 3 wt %, preferably 1 to 2 wt %, per 100 wt % of the polyester composition forming the layer (B). A content of less than 0.4 wt % results in poor adhesion to the surface layer (A), and delamination occurs at the lamination interface. Meanwhile, when the content is more than 3 wt %, the film has poor hydrolysis resistance, and the retention of strength and elongation is reduced, accelerating degradation. Such a content also results in poor adhesion to other laminated materials.

In the case of a three-layer structure where the surface layer (A) is provided on each side of the substrate layer (B), the substrate layer (B) contains rutile-type titanium dioxide particles in an amount of 0.1 to 4 wt %, preferably 0.4 to 4 wt %, still more preferably 1 to 3 wt %, per 100 wt % of the polyester composition forming the layer (B). A content of less than 0.1 wt % results in poor adhesion to the surface layer (A), and delamination occurs at the lamination interface.

Intra-Layer Cohesive Strength of Substrate Layer (B)

In the laminated polyester film for solar cell backsheets of the invention, the intra-layer cohesive strength of the substrate layer (B) is preferably not less than 8 N/15 mm, and still more preferably not less than 12 N/15 mm.

The laminated polyester film for solar cell backsheets of the invention is incorporated into a solar cell as follows. The laminated polyester film is directly laminated to an encapsulant layer of a solar cell module, as typified by an ethylene-vinyl acetate copolymer (hereinafter referred to as EVA), in such a manner that the substrate layer (B) side is in contact with the encapsulant layer, and then bonded thereto by a bonding method such as vacuum-suction heat lamination. Alternatively, the laminated polyester film is bonded to the encapsulant layer after another film or sheet is laminated to the substrate layer (B) side via an adhesive.

In any method, when the intra-layer cohesive strength of the substrate layer (B) is less than 8 N/15 mm, the layer (B) is broken by external mechanical impact, resulting in low resistance to impact. Further, separation occurs during the lamination of an encapsulant layer or an adhesive layer, resulting in poor adhesion.

As a method for making the adhesion strength of the substrate layer (B) not less than 8 N/15 mm, the substrate layer (B) is configured to have a resin composition and a titanium oxide particle content within the claimed ranges, and, in film production, the resin melt-extruding temperature and the stretching conditions are set within the below-mentioned ranges.

Average Content of Rutile-Type Titanium Dioxide Particles in All Layers

In the laminated polyester film for solar cell backsheets of the invention, the average content of rutile-type titanium dioxide particles in all layers is 3 to 8 wt % and preferably 4 to 6 wt %. The average content of rutile-type titanium dioxide particles in all layers (wt %) is defined by the following equation.

Average content of rutile-type titanium dioxide particles in all layers (wt %)=content of rutile-type titanium dioxide particles in the surface layer (A) (wt %)×(thickness of the surface layer (A)/total film thickness)+content of rutile-type titanium dioxide particles in the substrate layer (B) (wt %)×(thickness of the substrate layer (B)/total film thickness)

When the average content of rutile-type titanium dioxide particles in all layers is less than 3 wt %, although this results in excellent hydrolysis resistance, the weatherability is poor, resulting in more discoloration or a greater reduction in mechanical characteristics caused by ultraviolet light. Meanwhile, when it is more than 8 wt %, although this results in excellent weatherability, the hydrolysis resistance is poor, and the retention of strength and elongation is reduced.

Laminated Polyester Film

In the invention, it is important that the weight average molecular weight of polyester in the laminated polyester film is 47,000 to 65,000. When the weight average molecular weight is less than 47,000, the film has insufficient heat resistance, hydrolysis resistance, weatherability, and adhesion to other laminated materials. A higher weight average molecular weight leads to better heat resistance, hydrolysis resistance, and adhesion. However, when the weight average molecular weight is more than 65,000, it is difficult to form a film of a composition containing rutile-type titanium dioxide particles. The preferred weight average molecular weight of polyester in the laminated polyester film is 52,000 to 60,000.

In the invention, the COOH end group concentration of polyester in the laminated polyester film is 6 to 25 eq/ton, and still more preferably 6 to 20 eq/ton. When the COOH end group concentration is more than 25 eq/ton, the film has poor hydrolysis resistance, and the retention of strength and elongation is reduced, accelerating degradation. Meanwhile, in order to obtain a film of less than 6 eq/ton, it is necessary to use a polyester with a lower COOH end group concentration as a raw material. The solid-state polymerization of raw materials thus takes a longer period of time, which is uneconomical.

In terms of interlayer adhesion and productivity, it is preferable that the laminated polyester film of the invention is produced by co-extrusion.

In the case of a two-layer structure where the surface layer (A) is provided on one side of the substrate layer (B), in order to obtain a laminated polyester film having a surface layer (A) provided on one side of a substrate layer (B), two extruders are prepared, and a composition for forming the surface layer (A) is fed to one, while a composition for forming the substrate layer (B) is fed to the other. The raw materials melted in respective extruders are laminated to form a two-layer structure of surface layer (A)/substrate layer (B) in a lamination block or a nozzle, for example, and discharged from a nozzle to give an unstretched laminated sheet. The unstretched laminated sheet can be biaxially stretched to give a laminated polyester film.

In the case of a three-layer structure where the surface layer (A) is provided on each side of the substrate layer (B), in order to obtain a laminated polyester film having a surface layer (A) provided on each side of a substrate layer (B), two extruders are prepared, and a composition for forming the surface layer (A) is fed to one, while a composition for forming the substrate layer (B) is fed to the other. The raw materials melted in respective extruders are laminated to form a three-layer structure of surface layer (A)/substrate layer (B)/surface layer (A) in a lamination block or a nozzle, for example, and discharged from a nozzle to give an unstretched laminated sheet, which can be biaxially stretched to give a laminated polyester film.

Additive

Known additives may be added to the polyester composition for the surface layer (A) and/or the substrate layer (B) to the extent that they do not interfere with objects of the invention. Examples of such additives include antioxidants, end-capping agents, heat stabilizers, UV absorbers, antistatic agents, and flame retardants. Examples of antioxidants include hindered-phenol-based compounds. Examples of heat stabilizers include phosphorus-based compounds. Examples of UV absorbers include benzotriazole-based compounds and triazine-based compounds.

The hydrolysis resistance of a polyester film increases with a decrease in the COOH end group concentration of polyester in the film. Therefore, for the purpose of further improving hydrolysis resistance, it is extremely effective to add an end-capping agent to the polyester composition. As such end-capping agents, monomers and/or polymers of known carbodiimide compounds and monomers and/or polymers of oxazoline compounds are usable.

Among them, a polymer of a carbodiimide compound is preferable, and a polymer of an aromatic carbodiimide compound, i.e., an aromatic polycarbodiimide, is particularly preferable.

The molecular weight of the carbodiimide polymer is preferably 2,000 to 40,000, and an aromatic polycarbodiimide having a molecular weight within this range is particularly preferable.

When an end-capping agent is used, it is preferable that the amount added is 0.1 to 2 wt % based on the weight of the polyester of the substrate layer (B). When the addition is within this range, hydrolysis resistance can be effectively improved. It is preferable that polycarbodiimide is added only to the substrate layer (B), because process contamination due to bleed-out during processing can be thus reduced.

Hydrolysis Resistance

In the laminated polyester film for solar cell backsheets of the invention, it is preferable that the elongation retention after aging for 3,000 hours in an environment with a temperature of 85° C. and a humidity of 85% RH is not less than 50%. Aging for 3,000 hours in an environment with a temperature of 85° C. and a humidity of 85% RH is one of accelerated tests for checking the hydrolyzability corresponding nearly to 30-year outdoor exposure. When the elongation retention mentioned above is less than 50%, degradation may be caused by the lack of hydrolysis resistance, and such a film is undesirable as a film for solar cell backsheets. An elongation retention of not less than 50% can be achieved when the layer structure of the film, the resin composition of each layer, and the weight average molecular weight of the laminated film are within the ranges of the invention.

Weatherability

The laminated polyester film for solar cell backsheets of the invention has such weatherability that before and after UV irradiation from the surface layer (A) side, the yellow index change $\Delta YI$ in the surface layer (A) is preferably not more than 10, and still more preferably not more than 5. When the $\Delta YI$ is within this range, particularly excellent weatherability against light can be obtained, making it possible to protect a solar cell over a long period of time.

The $\Delta YI$ is the variation in the YI value of a film before and after the film is subjected to UV irradiation at an irradiation intensity of 200 W/m$^2$ for 10 hours using to a high-pressure mercury lamp, and is calculated from the YI values of the film before and after UV irradiation, which are measured using an automatic color-difference meter (SE-Σ90 model) manufactured by Nippon Denshoku Industries, by the following equation.

$$\Delta YI = YI \text{ value after irradiation} - YI \text{ value before irradiation}$$

Further, in the laminated polyester film for solar cell backsheets of the invention, the breaking elongation retention after UV irradiation based on the breaking elongation before UV irradiation is preferably not less than 50%, and still more preferably not more than 60%. When the film has such a breaking elongation retention, the film has sufficient weatherability, and can protect a solar cell over a long period of time as a film for solar cell backsheets.

Film Production Method

In the laminated polyester film for solar cell backsheets of the invention, the weight average molecular weight and COOH end group concentration of polyester in the laminated film are 47,000 to 65,000 and 6 to 25 eq/ton, respectively. However, it is not necessarily required that the polyester of each of the layers forming the laminated film satisfies this condition, and what is necessary is that the laminated film as a whole satisfies the condition.

In order for the weight average molecular weight and COOH end group concentration of polyester in the laminated polyester film to be 47,000 to 65,000 and 6 to 25 eq/ton, respectively, a polyester having an intrinsic viscosity of 0.68 to 0.95 and an COOH end group concentration of 3 to 30 eq/ton, for example, is used as a raw material polyester for film production. A polyester having a COOH end group concentration of 3 to 30 eq/ton can be obtained by solid-state polymerization, for example.

The laminated polyester film for solar cell backsheets of the invention can be produced using such a raw material polyester according to a known film production method. As an example thereof, a production method using a polyester and master pellets of a polyester containing titanium oxide particles will be described hereinafter. Hereinafter, the glass transition temperature is referred to as Tg, and the melting point is referred to as Tm.

First, a polyester and master pellets are blended in a predetermined ratio to prepare a polyester composition to be used for a surface layer (A) and a polyester composition to be used for a substrate layer (B). After drying as needed, the compositions are individually melt-mixed in separate extruders at a temperature of 270 to 290° C., and an unstretched laminated sheet is produced by simultaneous multilayer extrusion using a feedblock.

In the case of a two-layer structure where the surface layer (A) is provided on one side of the substrate layer (B), a polymer melt for forming the surface layer (A) and a polymer melt for forming the substrate layer (B) are laminated in two layers using a feedblock to give surface layer (A)/substrate layer (B), then delivered to a slit die, and extruded. At this time, the polymers laminated in the feedblock maintain the laminated form. When the melt-mixing temperature is less than 270° C., the resin does not melt sufficiently, which increases the load on the extruder; therefore, this is unsuitable. Meanwhile, when it is more than 290° C., the degradation of the resin is accelerated, resulting in a decrease in the hydrolysis resistance of the film; therefore, this is unsuitable.

In the case of a three-layer structure where the surface layer (A) is provided on each side of the substrate layer (B), a polymer melt for forming the surface layer (A) and a polymer melt for forming the substrate layer (B) are laminated in three layers using a feedblock to give surface layer (A)/substrate layer (B)/surface layer (A), then delivered to a slit die, and extruded. At this time, the polymers laminated in the feedblock maintain the laminated form. When the melt-mixing temperature is less than 270° C., the resin does not melt sufficiently, which increases the load on the extruder; therefore, this is unsuitable. Meanwhile, when it is more than 290° C., the degradation of the resin is accelerated, resulting in a decrease in the hydrolysis resistance of the film; therefore, this is unsuitable.

Next, the obtained unstretched laminated sheet is stretched at least uniaxially, preferably biaxially. The stretching may be sequential biaxial stretching or simultaneous biaxial stretching. In the case of sequential biaxial stretching, the polymers extruded from a slit die are cooled and solidified on a casting drum into an unstretched laminated sheet. This unstretched laminated sheet is heated by roll heating, infrared heating, or the like, and stretched in the longitudinal direction to give a longitudinally stretched laminated film. The stretching is preferably performed utilizing the difference in peripheral speed between two or more rolls. The stretching temperature is preferably not more than Tg of the polyester, and still more preferably Tg to (Tg+70° C.)

Subsequently, the longitudinally stretched film is successively subjected to transverse stretching, heat set, and heat relaxation treatments to form a biaxially oriented film. These treatments are performed while running the film. The transverse stretching treatment is started at a temperature higher than the Tg of the polyester. The treatment is then continued while raising the temperature to a temperature (5 to 70)° C. higher than the Tg. The rise of temperature in the transverse stretching process may be continuous or stepwise (sequential), but the temperature is usually raised sequentially. For example, the transverse stretching zone of a tenter is divided into several sections along the film running direction, and a heating medium having a predetermined temperature is poured into each zone to increase the temperature.

In the case of a two-layer structure where the surface layer (A) is provided on one side of the substrate layer (B), the draw ratios in the longitudinal direction and the direction orthogonal to the longitudinal direction (hereinafter referred to as transverse direction) are both preferably 3.0 to 4.2, and still more preferably 3.2 to 4.0. When it is less than 3.0, a film with satisfactory film thickness variation cannot be obtained. Further, although the cohesive strength of the substrate layer (B) is increased, the film has reduced hydrolysis resistance; therefore, this is undesirable. Meanwhile, when it is more than 4.2, although this results in excellent hydrolysis resistance, the cohesive strength of the substrate layer (B) is reduced; therefore, this is undesirable.

In the case of a three-layer structure where the surface layer (A) is provided on each side of the substrate layer (B), the draw ratios in the longitudinal direction and the transverse direction are both preferably 2.5 to 4.5, and still more preferably 2.8 to 4.2. When it is less than 2.5, the film is impaired in terms of thickness variation, and an excellent film cannot be obtained; therefore, this is undesirable. Meanwhile, when it is more than 4.5, rupture is likely to occur during film production; therefore, this is undesirable.

By heat-treating the transversely stretched film at (Tm—100° C.) to (Tm—20° C.) at a constant width or a 10% or less width reduction while holding both ends of the film, thereby reducing the thermal shrinkage rate, the dimensional stability of the film is improved. When the heat treatment is performed at a higher temperature, the film has reduced flatness and greater variation in thickness; therefore, this is undesirable. Meanwhile, when the heat treatment is performed at a lower temperature, this may results in an increased thermal shrinkage rate; therefore, this is undesirable.

The thickness of the biaxially stretched laminated polyester film is preferably 20 to 350 μm, still more preferably 40 to 250 μm, and particularly preferably 50 to 200 μm. A thickness of less than 20 μm results in reduced weatherability and thus is undesirable, while a thickness of more than 350 μm is simply uneconomical.

When an encapsulating resin for a solar cell device is provided on the laminated polyester film for solar cell backsheets of the invention, an easily adhesive coating layer may be provided on the substrate layer (B) for the purpose of improving the adhesion between the film and the encapsulating resin. As a component of the coating layer, it is preferable to use a material that shows excellent adhesion to both the polyester film and EVA. Examples of such materials include polyester resins and acrylic resins, and it is preferable to further add a crosslinking component to these resins.

For the application of the coating layer, a generally known coating method can be used. It is preferable to employ an in-line coating method, in which an aqueous liquid containing components of the coating layer as mentioned above is applied to a stretchable polyester film and then dried, followed by stretching and heat-treating. At this time, the thickness of the coating layer formed on the film is preferably 0.01 to 1 μm.

Solar Cell Backsheet

It is preferable that a water vapor barrier layer is laminated to the laminated film for solar cell backsheets of the invention to form a laminate to serve as a solar cell backsheet. The laminate preferably has a water vapor permeability of not more than 5 g/(m²·24 h) as measured according to JIS Z0208-73.

As the water vapor barrier layer, a film or foil having water vapor barrier properties may be used, or a deposited film or coating film of a metal oxide may also be used.

As films having water vapor barrier properties, for example, polyvinylidene chloride films, polyvinylidene-chloride-coated films, polyvinylidene-fluoride-coated films, films provided with a deposited thin film of inorganic oxides, and films provided with a deposited thin film of metals are usable. Examples of films provided with a deposited thin film of inorganic oxides include deposited silicon oxide films and deposited aluminum oxide films, and examples of films provided with a deposited thin film of metals include deposited aluminum films.

Examples of foils having water vapor barrier properties include aluminum foil and copper foil.

When a film or foil having water vapor barrier properties is used as the water vapor barrier layer, the film or foil having water vapor barrier properties is preferably laminated via an adhesive to at least one side of the laminated film for solar cell backsheets.

Further, a deposited thin film or coating film of an inorganic oxide or a deposited thin film of a metal may also be used as the water vapor barrier layer. For the deposited thin film or coating film of an inorganic oxide, silicon oxides and aluminum oxides can be used, for example. For the deposited thin film of a metal, aluminum can be used, for example.

The solar cell backsheet including a deposited thin film layer of an inorganic oxide laminated to the laminated polyester film for solar cell backsheets of the invention has excellent water vapor barrier properties and thus is preferable.

The laminated polyester film for solar cell backsheets of the invention may be used alone, and it is also possible to use two or more such films bonded together. Further, it is also possible to use the film bonded to another transparent polyester film for the purpose of improving insulating characteristics, and it is also possible to bond the film to a film made of a high-weatherability resin, such as polyvinyl fluoride, for the purpose of improving durability.

EXAMPLES

Hereinafter, the invention will be described in detail with reference to examples. Evaluation methods are shown.
(1) Thickness of Film The thickness of a film specimen was measured at 10 points using an electric micrometer (K-402B manufactured by Anritsu), and the average was taken as the thickness of the film.
(2) Thickness of Each Layer A triangular specimen was cut from a film, fixed to an embedding capsule, and then embedded in an epoxy resin. Subsequently, using a microtome (ULTRACUT-S), the embedded sample was cut into a 50-nm-thick thin-film section along a cross-section parallel to the longitudinal direction, and then photographed for observation at an acceleration voltage of 100 kv using a transmission electron microscope. The thickness of each layer was measured from the photograph, and the average thickness was determined.
(3) Glass Transition Temperature (Tg), Melting Point (Tm)

Using a differential scanning calorimeter MDSC Q100 manufactured by TA Instruments, the glass transition temperature and melting peak of a film specimen was determined at temperature rise rate of 20° C./min. The sample amount was 10 mg in the case of measurement on a polyester raw material, and was 20 mg in the case of measurement on a polyester film.
(4) Intrinsic Viscosity (IV)

A film specimen was dissolved in a mixed solvent of phenol:tetrachloroethane in a weight ratio of 6:4, and measurement was performed at a temperature of 35° C. With respect to a film, after dissolution in a solvent, fillers such as titanium oxide particles were removed using a centrifuge, and measurement was performed at a temperature of 35° C.
(5) COOH End Group Concentration 10 mg of a film specimen was dissolved in 0.5 ml of a mixed solvent of HFIP (hexafluoroisopropanol):deuterated chloroform=1:3, then several drops of isopropylamine were added thereto, and the quantity was determined by $^1$H-NMR (50° C., 600 MHz).
(6) Hydrolysis Resistance A film was aged in an atmosphere of 85° C. and 85% RH for 3000 hours, and then the breaking elongation of the film was measured according to ASTM-D61T. Taking the breaking elongation before aging as 100%, the ratio thereto (breaking elongation retention) was calculated and evaluated according to the following criteria.

AA: Breaking elongation retention of more than 80%

A: Breaking elongation retention of not less than 50% and less than 80%

B: Breaking elongation retention of not less than 30% and less than 50%

F: Breaking elongation retention of less than 30%
(7) Weatherability (Discoloration)

Using a high-pressure mercury lamp (TOS CURE 401 manufactured by Toshiba), a film was subjected to UV irradiation for 10 hours at an irradiation intensity of 200 W/m². Using the pre-measured YI value of the film before UV irradiation and the YI value of the film before UV irradiation, $\Delta$YI was calculated by the equation below, and the light resistance was evaluated according to the criteria below. The YI value, a yellow index, was measured using an automatic color-difference meter (SE-Σ90 model) manufactured by Nippon Denshoku Industries. In the case of a two-layer laminated film, the measurement was performed on the surface layer (A) side.

$$\Delta YI = YI \text{ value after irradiation} - YI \text{ value before irradiation}$$

A: $\Delta$YI of less than 5

B: $\Delta$YI of not less than 5 and less than 10

F: $\Delta$YI of not less than 10
(8) Weatherability (Mechanical Characteristics)

Using a high-pressure mercury lamp (TOS CURE 401 manufactured by Toshiba), a film was subjected to UV irradiation for 10 hours at an irradiation intensity of 200 W/m². Subsequently, the breaking elongation of the film was measured according to ASTM-D61T. Taking the breaking elongation before UV irradiation as 100%, the ratio thereto (breaking elongation retention) was calculated and evaluated according to the criteria below. When the film was a two-layer laminated film, the surface layer (A) side was subjected to UV irradiation.

A: Breaking elongation retention of not less than 50%

B: Breaking elongation retention of not less than 30% and less than 50%

F: Breaking elongation retention of less than 30%
(9) Heat Resistance

A strip-shaped specimen cut to 100 mm in length in the lengthwise direction of a film and 10 mm in wide in the widthwise direction of the film was subjected to a dry heat treatment at 180° C. for 500 hours. Subsequently, the lengthwise breaking elongation of the film was measured according to ASTM-D61T. Taking the breaking elongation of the specimen before the treatment as 100%, the ratio thereto (breaking elongation retention) was calculated, and heat resistance was evaluated according to the criteria below. Higher breaking elongation retention leads to better heat resistance.

A: Breaking elongation retention of not less than 50%

F: Breaking elongation retention of less than 50%

(10) Interlayer Delamination Properties

In the surface layer (A) of a film specimen, 25 cross-cuts were formed using a cutter at intervals of 3 mm. Subsequently, Sellotape® (CT405AP-18 manufactured by Nichiban) was pasted onto the surface, and pressure-bonded thereto using a rubber roller. Next, the specimen was fixed with a double-stick tape, and the Sellotape® was forcibly peeled off by hand in the 90° direction. The degree of peeling was visually observed, and the average of five tests was judged according to the criteria below.

A and AA pass the test.

AA: Extremely good (peeled area: not more than two squares)

A: Good (peeled area: not less than two squares and less than five squares)

B: Slightly poor (peeled area: not less than five squares)

(11) Average Particle Size of Inorganic Fine Particles

With respect to inorganic fine particles used as a raw material, the average particle size was measured using a particle size analyzer LA-750 manufactured by HORIBA. The particle size corresponding to 50 mass % was read, and such a value was taken as the average particle size.

(12) Extrudability

Extrudability was evaluated according to the following criteria:

A: extrusion is easy;

F: extrusion load is high, and it takes time and cost to form a film.

(13) Intra-Layer Cohesive Strength

A specimen of the substrate layer (B) slit into 15-mm-wide strips was pasted to a glass plate via an acrylic pressure sensitive adhesive (20 µm thick), then subjected to hot-air drying at 180° C. for 30 minutes to cure the pressure sensitive adhesive, and used. It was placed in a tensile tester, and subjected to 180° peeling at a tension rate of 500 mm/min to measure the peel strength between the film specimen and the glass plate (unit: N/15 mm). The thickness of the film specimen after peeling was measured to determine the separation interface in the specimen. As a result, in all the samples of Examples and Comparative Examples, intra-layer separation occurred in the substrate layer (B). Such peel strength was defined as intra-layer cohesive strength. With respect to Comparative Example 12, peel strength was measured in the same manner as in the Examples, except that the surface layer (A) was pasted to a glass plate. In Comparative Example 12, separation occurred in the surface layer (A), and this value was taken as intra-layer cohesive strength.

AA: Extremely good (cohesive strength: not less than 12 N/15 mm)

A: Good (cohesive strength: not less than 8 N/15 mm and less than 12 N/15 mm)

B: Slightly poor (cohesive strength: not less than 6N/15 mm and less than 8 N/15 mm)

F: Poor (cohesive strength: less than 6 N/15 mm)

(14) Weight Average Molecular Weight

To 3 mg of a laminated polyester film, 0.5 ml of HFIP:chloroform (1:1) was added for dissolution (one night), and the insoluble matter was filtered through a 0.45 µm membrane filter, followed by GPC analysis. The measurement devices and conditions are as follows.

GPC: HLC-8020 manufactured by Tosoh Corporation

Detector: UV-8010 manufactured by Tosoh Corporation

Column: TSK-gel GMHHR-M×2 manufactured by Tosoh Corporation

Mobile phase: chloroform for HPLC

Flow rate: 1.0 ml/min

Column temperature: 40° C.

Detector: UV (254 nm)

Amount poured: 200 µl

Specimen for calibration curve: polystyrene (EasiCal "PS-1" manufactured by Polymer Laboratories)

Reference Example 1

Production of Polyethylene Terephthalate (PET-a)

100 parts by weight of dimethyl terephthalate, 61 parts by weight of ethylene glycol, and 0.06 parts by weight of magnesium acetate tetrahydrate were fed to a reaction vessel for transesterification, melted by heating to 150° C., and stirred. The reaction was allowed to proceed while slowly raising the temperature in the reaction vessel to 235° C., and the resulting methanol was distilled out of the reaction vessel. After the completion of methanol distillation, 0.02 parts by weight of trimethyl phosphate was added thereto. After the addition of trimethyl phosphate, 0.03 parts by weight of antimony trioxide was added thereto, and the reaction product was transferred to a polymerization apparatus. Subsequently, the temperature in the polymerization apparatus was raised from 235° C. to 290° C. over 90 minutes, and, at the same time, the pressure in the apparatus was reduced from atmospheric pressure to 100 Pa over 90 minutes. When the stirring torque of the contents of the polymerization apparatus reached a predetermined value, the inside of the apparatus was returned to atmospheric pressure with nitrogen gas to complete polymerization. The bulb at the bottom of the polymerization apparatus was opened to pressurize the inside of the polymerization apparatus with nitrogen gas, and polyethylene terephthalate that had undergone polymerization was discharged into water in the form of strands. The strands were cut into chips using a cutter. Thus, a polyethylene terephthalate polymer having an intrinsic viscosity of 0.65 dl/g was obtained. This is called PET-a.

Reference Example 2

Production of Polyethylene Terephthalate (PET-b)

The polymer (PET-a) obtained in Reference Example 1 was pre-dried at 150 to 160° C. for 3 hours, and then subjected to solid-state polymerization for 7 hours in a nitrogen gas atmosphere at 210° C. and 100 torr. The intrinsic viscosity after solid-state polymerization was 0.85 dl/g. This is called PET-b.

Reference Example 3

Production of Polyethylene Terephthalate (PET-c)

The polymer (PET-a) obtained in Reference Example 1 was pre-dried at 150 to 160° C. for 3 hours, and then subjected to solid-state polymerization for 12 hours in a nitrogen gas atmosphere at 210° C. and 100 torr. The intrinsic viscosity after solid-state polymerization was 0.93 dl/g. This is called PET-c.

Reference Example 4

Production of Polyethylene Terephthalate (PET-d)

The polymer (PET-a) obtained in Reference Example 1 was pre-dried at 150 to 160° C. for 3 hours, and then subjected to solid-state polymerization for 3 hours in a nitrogen gas atmosphere at 210° C. and 100 torr. The intrinsic viscosity after solid-state polymerization was 0.73 dl/g. This is called PET-d.

Reference Example 5

Production of Polyethylene Terephthalate (PET-e)

The polymer (PET-a) obtained in Reference Example 1 was pre-dried at 150 to 160° C. for 3 hours, and then subjected to solid-state polymerization for 14 hours in a nitrogen gas atmosphere at 210° C. and 100 torr. The intrinsic viscosity after solid-state polymerization was 0.98 dl/g. This is called PET-e.

Reference Example 6

60 parts by weight of PET-a obtained in Reference Example 1 and 40 parts by weight of rutile-type titanium dioxide particles JR301 (average particle size: 0.3 μm) manufactured by Tayca Corporation were blended, fed to a twin-screw kneader, and melted at 280° C. The melt-kneaded polyester composition was discharged into water in the shape of strands, and cut into chips using a cutter. This is called PET-f.

Reference Example 7

60 parts by weight of PET-b obtained in Reference Example 2 and 40 parts by weight of rutile-type titanium dioxide particles JR301 (average particle size: 0.3 μm) manufactured by Tayca Corporation were blended, fed to a twin-screw kneader, and melted at 280° C. The melt-kneaded polyester composition was discharged into water in the shape of strands, and cut into chips using a cutter. This is called PET-g.

Reference Example 8

60 parts by weight of PET-c obtained in Reference Example 3 and 40 parts by weight of rutile-type titanium dioxide particles JR301 (average particle size: 0.3 μm) manufactured by Tayca Corporation were blended, fed to a twin-screw kneader, and melted at 280° C. The melt-kneaded polyester composition was discharged into water in the shape of strands, and cut into chips using a cutter. This is called PET-h.

Reference Example 9

60 parts by weight of PET-d obtained in Reference Example 4 and 40 parts by weight of rutile-type titanium dioxide particles JR301 (average particle size: 0.3 μm) manufactured by Tayca Corporation were blended, fed to a twin-screw kneader, and melted at 280° C. The melt-kneaded polyester composition was discharged into water in the shape of strands, and cut into chips using a cutter. This is called PET-i.

Reference Example 10

60 parts by weight of PET-e obtained in Reference Example 5 and 40 parts by weight of rutile-type titanium dioxide particles JR301 (average particle size: 0.3 μm) manufactured by Tayca Corporation were blended, fed to a twin-screw kneader, and melted at 280° C. The melt-kneaded polyester composition was discharged into water in the shape of strands, and cut into chips using a cutter. This is called PET-j.

Reference Example 11

60 parts by weight of PET-b obtained in Reference Example 2 and 40 parts by weight of sedimentary barium sulfate particles 300R (average particle size: 0.7 μm) manufactured by Sakai Chemical Industry were blended, fed to a twin-screw kneader, and melted at 280° C. The melt-kneaded polyester composition was discharged into water in the shape of strands, and cut into chips using a cutter. This is called PET-k.

Reference Example 12

80 parts by weight of the PET-b obtained in Reference Example 2 and 20 parts by weight of Stabaxol P-100 manufactured by Rhein Chemie as a polycarbodiimide compound were blended, fed to a twin-screw kneader, and melted at 280° C. The melt-kneaded polyester composition was discharged into water in the shape of strands, and cut into chips using a cutter. This is called PET-l.

Example 1

For the surface layer (A), PET-b obtained in Reference Example 2 and PET-g obtained in Reference Example 7 were mixed so that the content of rutile-type titanium dioxide particles was 20 wt %. The mixture was dried at 180° C. for 3 hours in a rotary vacuum dryer, then fed to an extruder 1, and melt-extruded at 280° C. For the substrate layer (B), PET-b obtained in Reference Example 2 and PET-g obtained in Reference Example 7 were mixed so that the content of titanium dioxide particles was 2 wt %. The mixture was dried at 180° C. for 3 hours in a rotary vacuum dryer, then fed to an extruder 2, and melt-extruded at 280° C. The resin compositions melted in respective extruders were joined together using a two-layer feedblock apparatus, and, while maintaining the laminated state, formed into a sheet through a slit die. Further, the sheet was cooled and solidified on a cooling drum having a surface temperature of 25° C. The resulting unstretched film was stretched 3.4 times the original length in the lengthwise direction (longitudinal direction) at 100° C., and cooled using 25° C. rolls. Subsequently, the longitudinally stretched film was guided to a tenter while both ends of the film are held with clips, and stretched 3.7 times the original length in the direction perpendicular to the length (transverse direction) in an atmosphere heated to 130° C. The film was then heat-set in an atmosphere heated to 220° C. in the tenter to make a 3% width reduction in the transverse direction, and cooled to room temperature to give a laminated polyester film for solar cell backsheets. The layer structure of the obtained film was as shown in Table 1, and the physical properties of the film were as shown in Table 2. In the table, "PET" represents polyethylene terephthalate, "titanium oxide" represents rutile-type titanium dioxide particles (average particle size: 0.3 μm), and "barium sulfate" represents barium sulfate particles (average particle size: 0.7 μm).

Examples 2 to 5 and Comparative Examples 1 to 5

White polyester films were obtained in the same manner as in Example 1, except that the contents of rutile-type titanium dioxide particles in the surface layer (A) and the substrate layer (B) were changed as shown in Table 1. The layer structure of the obtained film was as shown in Table 1, and the physical properties of the film were as shown in Table 2.

Comparative Example 6

PET-b obtained in Reference Example 2 and PET-g obtained in Reference Example 7 were mixed so that the content of rutile-type titanium dioxide particles was 14 wt %, and the mixture was dried at 180° C. for 3 hours in a rotary vacuum dryer. Dried chips were fed to an extruder 2, melt-extruded at 280° C., and then formed into a sheet through a slit die. Stretching and subsequent processes were performed in the same manner as in Example 1, and a laminated polyester film for solar cell backsheets was thus obtained. The physical properties of the obtained film were as shown in Table 2.

Examples 6 to 7 and Comparative Examples 7 to 8

Laminated polyester films for solar cell backsheets were obtained in the same manner as in Example 1, except that the thicknesses of the surface layer (A) and the substrate layer (B) were each changed as shown in Table 1. The physical properties of the obtained film were as shown in Table 2.

Example 8

A laminated polyester film for solar cell backsheets was obtained in the same manner as in Example 1, except that the resin compositions for the surface layer (A) and the substrate layer (B) were each obtained from a mixture of PET-c obtained in Reference Example 3 and PET-h obtained in Reference Example 8. The rutile-type titanium dioxide particle content and layer structure of the obtained film were as shown in Table 1, and the physical properties of the film were as shown in Table 2.

Example 9

A laminated polyester film for solar cell backsheets was obtained in the same manner as in Example 1, except that the resin compositions for the surface layer (A) and the substrate layer (B) were each obtained from a mixture of PET-d obtained in Reference Example 4 and PET-i obtained in Reference Example 9. The rutile-type titanium dioxide particle content and layer structure of the obtained film were as shown in Table 1, and the physical properties of the film were as shown in Table 2.

Comparative Example 9

A white polyester film was obtained in the same manner as in Example 1, except that the resin compositions for the surface layer (A) and the substrate layer (B) were each obtained from a mixture of PET-a obtained in Reference Example 1 and PET-f obtained in Reference Example 6. The rutile-type titanium dioxide particle content and layer structure of the obtained film were as shown in Table 1, and the physical properties of the film were as shown in Table 2.

Comparative Example 10

A laminated polyester film for solar cell backsheets was obtained in the same manner as in Example 1, except that the resin compositions for the surface layer (A) and the substrate layer (B) were each obtained from a mixture of PET-e obtained in Reference Example 5 and PET-j obtained in Reference Example 10. The rutile-type titanium dioxide particle content and layer structure of the obtained film were as shown in Table 1, and the physical properties of the film were as shown in Table 2.

Comparative Example 11

A laminated polyester film for solar cell backsheets was obtained in the same manner as in Example 1, except that the resin compositions for the surface layer (A) and the substrate layer (B) were each obtained from a mixture of PET-b obtained in Reference Example 2 and PET-k obtained in Reference Example 11. The barium sulfate particle content and layer structure of the obtained film were as shown in Table 1, and the physical properties of the film were as shown in Table 2.

Example 10

A white polyester film was obtained in the same manner as in Example 1, except that the resin composition for the substrate layer (B) was obtained from a mixture of PET-b obtained in Reference Example 2, PET-g obtained in Reference Example 7, and PET-1 obtained in Reference Example 12. The rutile-type titanium dioxide particle content, additive content, and layer structure of the obtained film were as shown in Table 1, and the physical properties of the film were as shown in Table 2. In the table, "P100" represents a polycarbodiimide compound (Stabaxol P-100 manufactured by Rhein Chemie).

Example 11

Preparation Example of Solar Cell Backsheet

Silicon oxide ($SiO_2$) was deposited on a 12-μm-thick biaxially oriented polyester film ('Teijin Tetoron Film NS-12' manufactured by Teijin DuPont Films) to give a silicon-oxide-deposited film having a silicon-oxide layer of 800 Å thickness. The deposited film was dry-laminated to the substrate layer (B) side of the white polyester film of Example 1 via a commercially available urethane-based adhesive (Adcoat AD-76P1 manufactured by Toyo-Morton). The adhesive was applied as follows: 1 part by weight of a curing agent was mixed with 10 parts by weight of the base compound, adjusted with ethyl acetate to 30 wt %, and applied to the non-deposition surface of the deposited film by a gravure roll method so that the coating thickness after drying the solvent was 5 μm. The drying temperature was 100° C. Further, the lamination conditions were such that it was performed using a roll laminator at a temperature of 60° C. and a pressure of 1 kg/cm. The curing conditions were such that it was performed at 60° C. for 3 days. The obtained film was a solar cell backsheet having excellent weatherability and hydrolysis resistance, as well as resistance to delamination of the films in the laminate.

TABLE 1

| | Resin Composition of Surface Layer (A) | | | | Resin Composition of Substrate Layer (B) | | | | | | Thickness of Each Layer (A)/(B)/(A) (μm/μm/μm) | All Layers Pigment Content (wt %) |
|---|---|---|---|---|---|---|---|---|---|---|---|---|
| | Kind of Polyester | Content (wt %) | Pigment | Content (wt %) | Kind of Polyester | Content (wt %) | Pigment | Content (wt %) | Additive | Content (wt %) | | |
| Example 1 | PET-b | 80 | Titanium oxide | 20 | PET-b | 98 | Titanium oxide | 2 | — | — | 10/40/0 | 5.6 |
| Example 2 | PET-b | 90 | Titanium oxide | 10 | PET-b | 98 | Titanium oxide | 2 | — | — | 10/40/0 | 3.6 |
| Example 3 | PET-b | 70 | Titanium oxide | 30 | PET-b | 98 | Titanium oxide | 2 | — | — | 10/40/0 | 7.6 |
| Comparative Example 1 | PET-b | 95 | Titanium oxide | 5 | PET-b | 98 | Titanium oxide | 2 | — | — | 10/40/0 | 2.6 |
| Comparative Example 2 | PET-b | 65 | Titanium oxide | 35 | PET-b | 98 | Titanium oxide | 2 | — | — | 10/40/0 | 8.6 |
| Example 4 | PET-b | 70 | Titanium oxide | 30 | PET-b | 99.6 | Titanium oxide | 0.4 | — | — | 10/40/0 | 6.3 |
| Example 5 | PET-b | 90 | Titanium oxide | 10 | PET-b | 97 | Titanium oxide | 3 | — | — | 10/40/0 | 4.4 |
| Comparative Example 3 | PET-b | 90 | Titanium oxide | 10 | PET-b | 95 | Titanium oxide | 5 | — | — | 10/40/0 | 6.0 |
| Comparative Example 4 | PET-b | 90 | Titanium oxide | 10 | PET-b | 100 | Titanium oxide | 0 | — | — | 10/40/0 | 2.0 |
| Comparative Example 5 | PET-b | 100 | — | 0 | PET-b | 83 | Titanium oxide | 17 | — | — | 10/40/0 | 13.6 |
| Comparative Example 6 | — | — | — | — | PET-b | 86 | Titanium oxide | 14 | — | — | 0/50/0 | 14.0 |
| Example 6 | PET-b | 80 | Titanium oxide | 20 | PET-b | 98 | Titanium oxide | 2 | — | — | 15/35/0 | 7.4 |
| Example 7 | PET-b | 80 | Titanium oxide | 20 | PET-b | 98 | Titanium oxide | 2 | — | — | 3/47/0 | 3.1 |
| Comparative Example 7 | PET-b | 80 | Titanium oxide | 20 | PET-b | 98 | Titanium oxide | 2 | — | — | 20/30/0 | 9.2 |
| Comparative Example 8 | PET-b | 80 | Titanium oxide | 20 | PET-b | 98 | Titanium oxide | 2 | — | — | 1/49/0 | 2.4 |
| Example 8 | PET-c | 80 | Titanium oxide | 20 | PET-c | 98 | Titanium oxide | 2 | — | — | 10/40/0 | 5.6 |
| Example 9 | PET-d | 80 | Titanium oxide | 20 | PET-d | 98 | Titanium oxide | 2 | — | — | 10/40/0 | 5.6 |
| Comparative Example 9 | PET-a | 80 | Titanium oxide | 20 | PET-a | 98 | Titanium oxide | 2 | — | — | 10/40/0 | 5.6 |
| Comparative Example 10 | PET-e | 80 | Titanium oxide | 20 | PET-e | 98 | Titanium oxide | 2 | — | — | 10/40/0 | 5.6 |
| Comparative Example 11 | PET-b | 80 | Barium sulfate | 20 | PET-b | 98 | Barium sulfate | 2 | — | — | 10/40/0 | 5.6 |
| Example 10 | PET-b | 80 | Titanium oxide | 20 | PET-b | 97 | Titanium oxide | 2 | P100 | 1 | 10/40/0 | 5.6 |

TABLE 2

| | Film Physical Properties | | | | | | | | |
|---|---|---|---|---|---|---|---|---|---|
| | Weight Average Molecular Weight | Extrudability Evaluation | Intra-Layer Cohesive Strength of Substrate Layer (B) | COOH End Group Concentration (eq/T) | Heat Resistance Evaluation | Hydrolysis Resistance Evaluation | Weatherability Discoloration | Mechanical Characteristics | Interlayer Delamination Evaluation |
| Example 1 | 55700 | A | A | 22 | A | A | A | A | AA |
| Example 2 | 56000 | A | A | 21 | A | A | A | A | AA |
| Example 3 | 55300 | A | A | 23 | A | A | A | A | A |
| Comparative Example 1 | 56300 | A | A | 20 | A | A | F | F | A |
| Comparative Example 2 | 55000 | A | A | 26 | A | B | A | A | B |
| Example 4 | 55500 | A | AA | 19 | A | A | A | A | A |
| Example 5 | 55900 | A | A | 23 | A | A | A | A | AA |
| Comparative Example 3 | 55700 | A | B | 25 | A | A | A | A | AA |
| Comparative Example 4 | 56400 | A | AA | 16 | A | A | A | A | B |

TABLE 2-continued

| | Film Physical Properties | | | | | | | | |
|---|---|---|---|---|---|---|---|---|---|
| | Weight Average Molecular Weight | Extrudability Evaluation | Intra-Layer Cohesive Strength of Substrate Layer (B) | COOH End Group Concentration (eq/T) | Heat Resistance Evaluation | Hydrolysis Resistance Evaluation | Weatherability Discoloration | Mechanical Characteristics | Interlayer Delamination Evaluation |
| Comparative Example 5 | 54000 | A | F | 30 | A | F | F | B | B |
| Comparative Example 6 | 53900 | A | F | 32 | A | F | A | A | — |
| Example 6 | 55300 | A | A | 23 | A | A | A | A | AA |
| Example 7 | 56100 | A | A | 21 | A | A | A | A | AA |
| Comparative Example 7 | 54900 | A | A | 27 | A | B | A | A | AA |
| Comparative Example 8 | 56300 | A | A | 20 | A | A | F | F | AA |
| Example 8 | 63000 | A | A | 20 | A | A | A | A | AA |
| Example 9 | 47500 | A | A | 25 | A | A | A | A | A |
| Comparative Example 9 | 42300 | A | B | 30 | B | B | A | A | A |
| Comparative Example 10 | 68000 | F | AA | 23 | A | A | A | A | AA |
| Comparative Example 11 | 53900 | A | A | 22 | A | A | F | F | AA |
| Example 10 | 65000 | A | A | 12 | A | AA | A | A | AA |

Example 12

For the surface layer (A), PET-b obtained in Reference Example 2 and PET-g obtained in Reference Example 7 were mixed so that the content of rutile-type titanium dioxide particles was 20 wt %. The mixture was dried at 180° C. for 3 hours in a rotary vacuum dryer, then fed to an extruder 1, and melt-extruded at 280° C. For the substrate layer (B), PET-b obtained in Reference Example 2 and PET-g obtained in Reference Example 7 were mixed so that the content of rutile-type titanium dioxide particles was 2 wt %. The mixture was dried at 180° C. for 3 hours in a rotary vacuum dryer, then fed to an extruder 2, and melt-extruded at 280° C. The resin compositions melted in respective extruders were joined together using a three-layer feedblock apparatus, and, while maintaining the laminated state, formed into a sheet through a slit die. Further, the sheet was cooled and solidified on a cooling drum having a surface temperature of 25° C. The resulting unstretched film was stretched 3.4 times the original length in the lengthwise direction (longitudinal direction) at 100° C., and cooled using 25° C. rolls. Subsequently, the longitudinally stretched film was guided to a tenter while both ends of the film were held with clips, and stretched 3.7 times the original length in the direction perpendicular to the length (transverse direction) in an atmosphere heated to 130° C. The film was then heat-set in an atmosphere heated to 220° C. in the tenter to make a 3% width reduction in the transverse direction, and cooled to room temperature to give a white polyester film. The layer structure of the obtained film was as shown in Table 3, and the physical properties of the film were as shown in Table 4.

Examples 13 to 16 and Comparative Examples 12 to 16

White polyester films were obtained in the same manner as in Example 12, except that the contents of rutile-type titanium dioxide particles in the surface layer (A) and the substrate layer (B) were changed as shown in Table 3. The layer structure of the obtained films was as shown in Table 3, and the physical properties of the films were as shown in Table 4.

Comparative Example 17

PET-b obtained in Reference Example 2 and PET-g obtained in Reference Example 7 were mixed so that the content of rutile-type titanium dioxide particles was 14 wt %, and the mixture was dried at 180° C. for 3 hours in a rotary vacuum dryer. Dried chips were fed to an extruder 2, melt-extruded at 280° C., and then formed into a sheet through a slit die. Stretching and subsequent processes were performed in the same manner as in Example 12, and a single-layer, white polyester film was thus obtained. The physical properties of the obtained film were as shown in Table 4.

Examples 17 to 18 and Comparative Examples 18 to 19

White polyester films were obtained in the same manner as in Example 12, except that the thicknesses of the surface layer (A) and the substrate layer (B) were each changed as shown in Table 3. The physical properties of the obtained films were as shown in Table 4.

Example 19

A white polyester film was obtained in the same manner as in Example 12, except that the resin compositions for the surface layer (A) and the substrate layer (B) were each obtained from a mixture of PET-c obtained in Reference Example 3 and PET-h obtained in Reference Example 8. The rutile-type titanium dioxide particle content and layer structure of the obtained film were as shown in Table 3, and the physical properties of the film were as shown in Table 4.

Example 20

A white polyester film was obtained in the same manner as in Example 12, except that the resin compositions for the surface layer (A) and the substrate layer (B) were each obtained from a mixture of PET-d obtained in Reference Example 4 and PET-i obtained in Reference Example 9. The rutile-type titanium dioxide particle content and layer structure of the obtained film were as shown in Table 3, and the physical properties of the film were as shown in Table 4.

Comparative Example 20

A white polyester film was obtained in the same manner as in Example 12, except that the resin compositions for the surface layer (A) and the substrate layer (B) were each obtained from a mixture of PET-a obtained in Reference Example 1 and PET-f obtained in Reference Example 6. The rutile-type titanium dioxide particle content and layer structure of the obtained film were as shown in Table 3, and the physical properties of the film were as shown in Table 4.

Comparative Example 21

A white polyester film was obtained in the same manner as in Example 12, except that the resin compositions for the surface layer (A) and the substrate layer (B) were each obtained from a mixture of PET-e obtained in Reference Example 5 and PET-j obtained in Reference Example 10. The rutile-type titanium dioxide particle content and layer structure of the obtained film were as shown in Table 3, and the physical properties of the film were as shown in Table 4.

Comparative Example 22

A white polyester film was obtained in the same manner as in Example 12, except that the resin compositions for the surface layer (A) and the substrate layer (B) were each obtained from a mixture of PET-b obtained in Reference Example 2 and PET-k obtained in Reference Example 11. The barium sulfate particle content and layer structure of the obtained film were as shown in Table 3, and the physical properties of the film were as shown in Table 4.

Example 21

A white polyester film was obtained in the same manner as in Example 12, except that the resin composition for the substrate layer (B) was obtained from a mixture of PET-b obtained in Reference Example 2, PET-g obtained in Reference Example 7, and PET-l obtained in Reference Example 12. The rutile-type titanium dioxide particle content, additive content, and layer structure of the obtained film were as shown in Table 3, and the physical properties of the film were as shown in Table 4. In the table, "P100" represents a polycarbodiimide compound (Stabaxol P-100 manufactured by Rhein Chemie).

Example 22

Preparation Example of Solar Cell Backsheet

Silicon oxide ($SiO_2$) was deposited on a 12-μm-thick biaxially oriented polyester film ('Teijin Tetoron Film NS-12' manufactured by Teijin DuPont Films) to give a silicon-oxide-deposited film having a silicon-oxide layer of 800 Å thickness. The deposited film was dry-laminated to the substrate layer (B) side of the white polyester film of Example via a commercially available urethane-based adhesive (Adcoat AD-76P1 manufactured by Toyo-Morton). The adhesive was applied as follows: 1 part by weight of a curing agent was mixed with 10 parts by weight of the base compound, adjusted with ethyl acetate to 30 wt %, and applied to the non-deposition surface of the deposited film by a gravure roll method so that the coating thickness after drying the solvent was 5 μm. The drying temperature was 100° C. Further, the lamination conditions were such that it was performed using a roll laminator at a temperature of 60° C. and a pressure of 1 kg/cm. The curing conditions were such that it was performed at 60° C. for 3 days. In this example, a solar cell backsheet having excellent weatherability and hydrolysis resistance, as well as resistance to delamination of the films in the laminate, was obtained

TABLE 3

| | Resin Composition of Surface Layer (A) | | | | Resin Composition of Substrate Layer (B) | | | | | All Layers | |
|---|---|---|---|---|---|---|---|---|---|---|---|
| | | | | | | | | | | Thickness of Each Layer | Pigment |
| | Kind of Polyester | Content (wt %) | Pigment | Content (wt %) | Kind of Polyester | Content (wt %) | Pigment | Content (wt %) | Additive | Content (wt %) | (A)/(B)/(A) (μm/μm/μm) | Content (wt %) |
| Example 12 | PET-b | 80 | Titanium oxide | 20 | PET-b | 98 | Titanium oxide | 2 | — | — | 5/40/5 | 5.6 |
| Example 13 | PET-b | 90 | Titanium oxide | 10 | PET-b | 98 | Titanium oxide | 2 | — | — | 5/40/5 | 3.6 |
| Example 14 | PET-b | 70 | Titanium oxide | 30 | PET-b | 98 | Titanium oxide | 2 | — | — | 5/40/5 | 7.6 |
| Comparative Example 12 | PET-b | 95 | Titanium oxide | 5 | PET-b | 98 | Titanium oxide | 2 | — | — | 5/40/5 | 2.6 |
| Comparative Example 13 | PET-b | 65 | Titanium oxide | 35 | PET-b | 98 | Titanium oxide | 2 | — | — | 5/40/5 | 8.6 |
| Example 15 | PET-b | 70 | Titanium oxide | 30 | PET-b | 99.6 | Titanium oxide | 0.4 | — | — | 5/40/5 | 6.32 |
| Example 16 | PET-b | 90 | Titanium oxide | 10 | PET-b | 96 | Titanium oxide | 4 | — | — | 5/40/5 | 5.2 |
| Comparative Example 14 | PET-b | 90 | Titanium oxide | 10 | PET-b | 95 | Titanium oxide | 5 | — | — | 5/40/5 | 6 |
| Comparative Example 15 | PET-b | 90 | Titanium oxide | 10 | PET-b | 100 | Titanium oxide | 0 | — | — | 5/40/5 | 2 |
| Comparative Example 16 | PET-b | 100 | — | 0 | PET-b | 83 | Titanium oxide | 17 | — | — | 5/40/5 | 13.6 |
| Comparative Example 17 | — | — | — | — | PET-b | 86 | Titanium oxide | 14 | — | — | 0/50/0 | 14 |

TABLE 3-continued

|  | Resin Composition of Surface Layer (A) | | | | Resin Composition of Substrate Layer (B) | | | | | | All Layers | |
| --- | --- | --- | --- | --- | --- | --- | --- | --- | --- | --- | --- | --- |
|  | Kind of Polyester | Content (wt %) | Pigment | Content (wt %) | Kind of Polyester | Content (wt %) | Pigment | Content (wt %) | Additive | Content (wt %) | Thickness of Each Layer (A)/(B)/(A) (µm/µm/µm) | Pigment Content (wt %) |
| Example 17 | PET-b | 80 | Titanium oxide | 20 | PET-b | 98 | Titanium oxide | 2 | — | — | 7.5/35/7.5 | 7.4 |
| Example 18 | PET-b | 80 | Titanium oxide | 20 | PET-b | 98 | Titanium oxide | 2 | — | — | 3/44/3 | 4.16 |
| Comparative Example 18 | PET-b | 80 | Titanium oxide | 20 | PET-b | 98 | Titanium oxide | 2 | — | — | 10/30/10 | 9.2 |
| Comparative Example 19 | PET-b | 80 | Titanium oxide | 20 | PET-b | 98 | Titanium oxide | 2 | — | — | 1/48/1 | 2.72 |
| Example 19 | PET-c | 80 | Titanium oxide | 20 | PET-c | 98 | Titanium oxide | 2 | — | — | 5/40/5 | 5.6 |
| Example 20 | PET-d | 80 | Titanium oxide | 20 | PET-d | 98 | Titanium oxide | 2 | — | — | 5/40/5 | 5.6 |
| Comparative Example 20 | PET-a | 80 | Titanium oxide | 20 | PET-a | 98 | Titanium oxide | 2 | — | — | 5/40/5 | 5.6 |
| Comparative Example 21 | PET-e | 80 | Titanium oxide | 20 | PET-e | 98 | Titanium oxide | 2 | — | — | 5/40/5 | 5.6 |
| Comparative Example 22 | PET-b | 80 | Barium sulfate | 20 | PET-b | 98 | Barium sulfate | 2 | — | — | 5/40/5 | 5.6 |
| Example 21 | PET-b | 80 | Titanium oxide | 20 | PET-b | 97 | Titanium oxide | 2 | P100 | 1 | 5/40/5 | 5.6 |

TABLE 4

|  | Film Physical Properties | | | | | | | | |
| --- | --- | --- | --- | --- | --- | --- | --- | --- | --- |
|  | Weight Average Molecular Weight | Extrudability Evaluation | Intra-Layer Cohesive Strength of Substrate Layer (B) | COOH End Group Concentration (eq/T) | Heat Resistance Evaluation | Hydrolysis Resistance Evaluation | Weatherability | | Interlayer Delamination Evaluation |
|  |  |  |  |  |  |  | Discoloration | Mechanical Characteristics |  |
| Example 12 | 55700 | A | A | 22 | A | A | A | A | AA |
| Example 13 | 56000 | A | A | 21 | A | A | A | A | AA |
| Example 14 | 55300 | A | A | 23 | A | A | A | A | A |
| Comparative Example 12 | 56300 | A | A | 20 | A | A | F | F | A |
| Comparative Example 13 | 55000 | A | A | 26 | A | B | A | A | B |
| Example 15 | 55600 | A | AA | 19 | A | A | A | A | A |
| Example 16 | 55700 | A | A | 25 | A | A | A | A | AA |
| Comparative Example 14 | 55600 | A | B | 27 | A | B | A | A | AA |
| Comparative Example 15 | 56400 | A | AA | 16 | A | A | A | A | B |
| Comparative Example 16 | 54000 | A | F | 30 | A | F | F | B | B |
| Comparative Example 17 | 53900 | A | F | 32 | A | F | A | A | — |
| Example 17 | 55300 | A | A | 24 | A | A | A | A | AA |
| Example 18 | 55700 | A | A | 21 | A | A | A | A | AA |
| Comparative Example 18 | 54900 | A | A | 27 | A | B | A | A | AA |
| Comparative Example 19 | 56200 | A | A | 20 | A | A | F | F | AA |
| Example 19 | 63000 | A | A | 20 | A | A | A | A | AA |
| Example 20 | 47500 | A | A | 25 | A | A | A | A | A |
| Comparative Example 20 | 42300 | A | B | 30 | B | B | A | A | A |
| Comparative Example 21 | 68000 | F | AA | 23 | A | A | A | A | AA |
| Comparative Example 22 | 53900 | A | A | 22 | A | A | F | F | AA |
| Example 21 | 65000 | A | A | 12 | A | AA | A | A | AA |

Industrial Applicability

The laminated polyester film for solar cell backsheets of the invention is useful as a solar cell backsheet.

The invention claimed is:

1. A laminated polyester film for solar cell backsheets, the laminated film comprising a surface layer (A) and a substrate layer (B), and characterized in that:
   the surface layer (A) is provided on at least one side of the substrate layer (B);
   the surface layer (A) is made of a polyester composition including 10 to 30 wt % of rutile-type titanium dioxide particles and 70 to 90 wt % of a polyester;
   the substrate layer (B) is made of a polyester composition including 0.1 to 4 wt % of rutile-type titanium dioxide particles and 96 to 99.9 wt % of a polyester;
   the substrate layer (B) has a thickness of 70% to 97% of the total film thickness;
   the weight average molecular weight of polyester in the laminated film is 47000 to 65000;
   the COOH end group concentration of polyester in the laminated film is 6 to 25 eq/ton; and
   the average content of rutile-type titanium dioxide particles in all layers of the laminated film is 3 to 8 wt %,
   wherein the average content of rutile-type titanium dioxide particles in all layers is defined by the following equation:

average content of rutile-type titanium dioxide particles in all layers (wt %)=content of rutile-type titanium dioxide particles in the surface layer (A)(wt %)×(thickness of the surface layer (A)/total film thickness)+content of rutile-type titanium dioxide particles in the substrate layer (B) (wt %)×(thickness of the substrate layer (B)/total film thickness).

2. A solar cell backsheet comprising at least one of a laminated polyester film for solar cell backsheets according to claim 1.

3. A laminated polyester film for solar cell backsheets according to claim 1, wherein the surface layer (A) is provided on one side of the substrate layer (B), and the substrate layer (B) is made of a polyester composition including 0.4 to 3 wt % of rutile-type titanium dioxide particles and 97 to 99.6 wt % of a polyester.

4. A solar cell backsheet comprising at least one of a laminated polyester film for solar cell backsheets according to claim 3.

5. A laminated polyester film for solar cell backsheets according to claim 3, wherein the substrate layer (B) has an intra-layer cohesive strength of not less than 8 N/15 mm.

6. A solar cell backsheet comprising a deposited thin film layer of an inorganic oxide laminated to a laminated polyester film for solar cell backsheets according to claim 5.

7. A solar cell backsheet comprising at least one of a laminated polyester film for solar cell backsheets according to claim 5.

8. A laminated polyester film for solar cell backsheets according to claim 1, wherein the surface layer (A) is provided on each side of the substrate layer (B), and the substrate layer (B) has a thickness of 70% to 95% of the total film thickness.

9. A solar cell backsheet comprising a deposited thin film layer of an inorganic oxide laminated to a laminated polyester film for solar cell backsheets according to claim 8.

10. A solar cell backsheet comprising at least one of a laminated polyester film for solar cell backsheets according to claim 8.

* * * * *